(12) United States Patent
Sato et al.

(10) Patent No.: US 10,833,184 B2
(45) Date of Patent: Nov. 10, 2020

(54) SEMICONDUCTOR DEVICE SUBSTRATE, SEMICONDUCTOR DEVICE, AND METHOD FOR MANUFACTURING SEMICONDUCTOR DEVICE SUBSTRATE

(71) Applicants: SANKEN ELECTRIC CO., LTD., Niiza (JP); SHIN-ETSU HANDOTAI CO., LTD., Tokyo (JP)

(72) Inventors: Ken Sato, Miyoshi-machi (JP); Hiroshi Shikauchi, Niiza (JP); Masaru Shinomiya, Annaka (JP); Keitaro Tsuchiya, Takasaki (JP); Kazunori Hagimoto, Takasaki (JP)

(73) Assignees: SANKEN ELECTRIC CO., LTD., Saitama (JP); SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/330,884

(22) PCT Filed: Feb. 24, 2017

(86) PCT No.: PCT/JP2017/007113
§ 371 (c)(1),
(2) Date: Mar. 6, 2019

(87) PCT Pub. No.: WO2018/051532
PCT Pub. Date: Mar. 22, 2018

(65) Prior Publication Data
US 2019/0214492 A1    Jul. 11, 2019

(30) Foreign Application Priority Data
Sep. 15, 2016    (JP) .................................. 2016-180857

(51) Int. Cl.
*H01L 29/205* (2006.01)
*H01L 29/207* (2006.01)
(Continued)

(52) U.S. Cl.
CPC ...... *H01L 29/7781* (2013.01); *H01L 21/0254* (2013.01); *H01L 21/02378* (2013.01);
(Continued)

(58) Field of Classification Search
None
See application file for complete search history.

(56) References Cited

U.S. PATENT DOCUMENTS

| 9,076,812 B2 | 7/2015 | Laboutin et al. |
| 2010/0123169 A1 | 5/2010 | Sato |

(Continued)

FOREIGN PATENT DOCUMENTS

| JP | 2010-123725 A | 6/2010 |
| JP | 2010-182872 A | 8/2010 |

(Continued)

OTHER PUBLICATIONS

Mar. 19, 2019 International Preliminary Report on Patentability issued in International Patent Application No. PCT/JP2017/007113.
(Continued)

*Primary Examiner* — Joseph C. Nicely
*Assistant Examiner* — Lamont B Koo
(74) *Attorney, Agent, or Firm* — Oliff PLC

(57) ABSTRACT

A semiconductor device substrate including: a substrate; a buffer layer which is provided on the substrate and made of a nitride semiconductor; and a device active layer which is formed of a nitride semiconductor layer provided on the buffer layer, the semiconductor device substrate in that the buffer layer includes: a first region which contains carbon and iron; a second region which is provided on the first region and has average concentration of iron lower than that in the first region and average concentration of carbon higher than that in the first region, and the average concentration of the carbon in the second region is lower than the
(Continued)

average concentration of the iron in the first region. The semiconductor device substrate which can suppress a transverse leak current in a high-temperature operation of a device while suppressing a longitudinal leak current and can inhibit a current collapse phenomenon is provided.

17 Claims, 7 Drawing Sheets

(51) Int. Cl.
　　*H01L 29/201*　　(2006.01)
　　*H01L 29/36*　　(2006.01)
　　*H01L 29/778*　　(2006.01)
　　*H01L 29/812*　　(2006.01)
　　*H01L 21/02*　　(2006.01)
　　*H01L 29/66*　　(2006.01)

(52) U.S. Cl.
　　CPC .. *H01L 21/02381* (2013.01); *H01L 21/02458* (2013.01); *H01L 21/02507* (2013.01); *H01L 21/02579* (2013.01); *H01L 21/02581* (2013.01); *H01L 29/66462* (2013.01); *H01L 29/778* (2013.01); *H01L 29/812* (2013.01); *H01L 21/0262* (2013.01)

(56) References Cited

U.S. PATENT DOCUMENTS

| | | |
|---|---|---|
| 2010/0244098 A1 | 9/2010 | Yokoyama |
| 2010/0244101 A1 | 9/2010 | Kokawa et al. |
| 2012/0091435 A1 | 4/2012 | Ikuta et al. |
| 2013/0075786 A1 | 3/2013 | Ishiguro |
| 2014/0091318 A1 | 4/2014 | Ishiguro et al. |
| 2014/0239308 A1* | 8/2014 | Hallin ............... H01L 21/02458 257/76 |
| 2016/0118486 A1 | 4/2016 | Shikauchi et al. |
| 2017/0033209 A1 | 2/2017 | Sato et al. |
| 2017/0133217 A1 | 5/2017 | Sato et al. |

FOREIGN PATENT DOCUMENTS

| | | |
|---|---|---|
| JP | 2010-232297 A | 10/2010 |
| JP | 2010-239034 A | 10/2010 |
| JP | 2010-287882 A | 12/2010 |
| JP | 2013-074211 A | 4/2013 |
| JP | 2014-072429 A | 4/2014 |
| JP | 2015-201574 A | 11/2015 |
| JP | 2015-207624 A | 11/2015 |
| TW | 201507008 A | 2/2015 |
| TW | 201541635 A | 11/2015 |

OTHER PUBLICATIONS

May 23, 2017 International Search Report issued in International Patent Application No. PCT/JP2017/007113.

Jun. 25, 2019 Office Action issued in Japanese Patent Application No. 2016-180857.

May 28, 2020 Office Action issued in Taiwanese Application No. 106107195.

* cited by examiner

[FIG. 1]
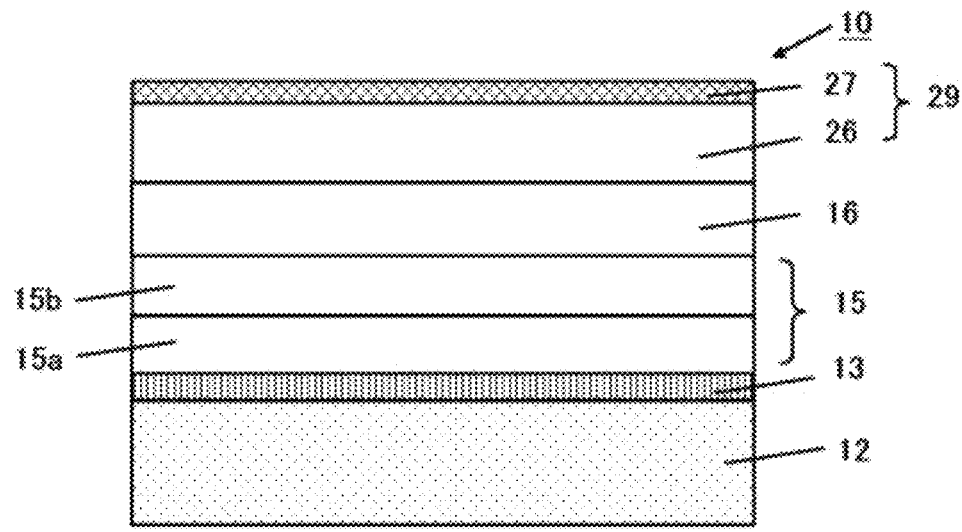
[FIG. 2]
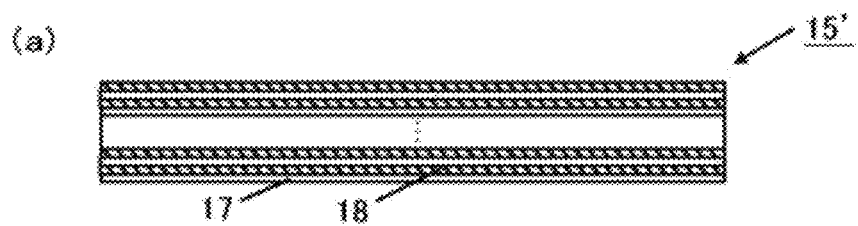
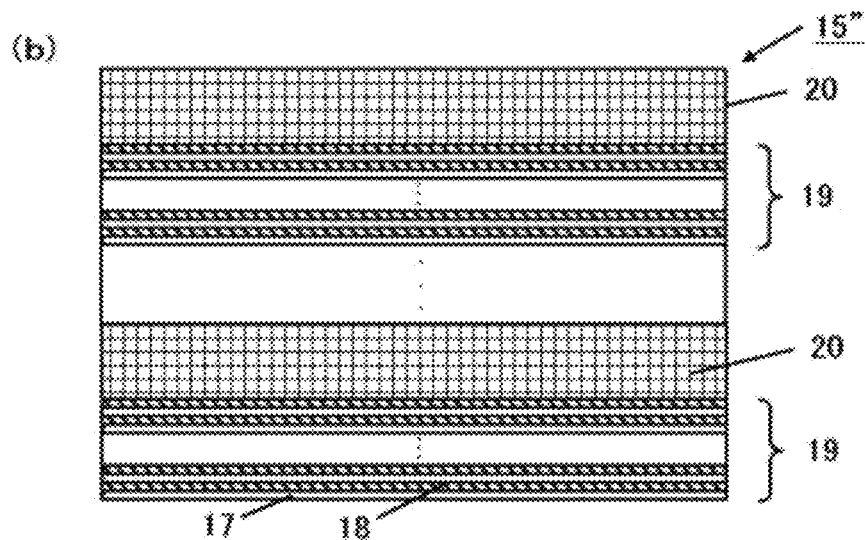

[FIG.3]
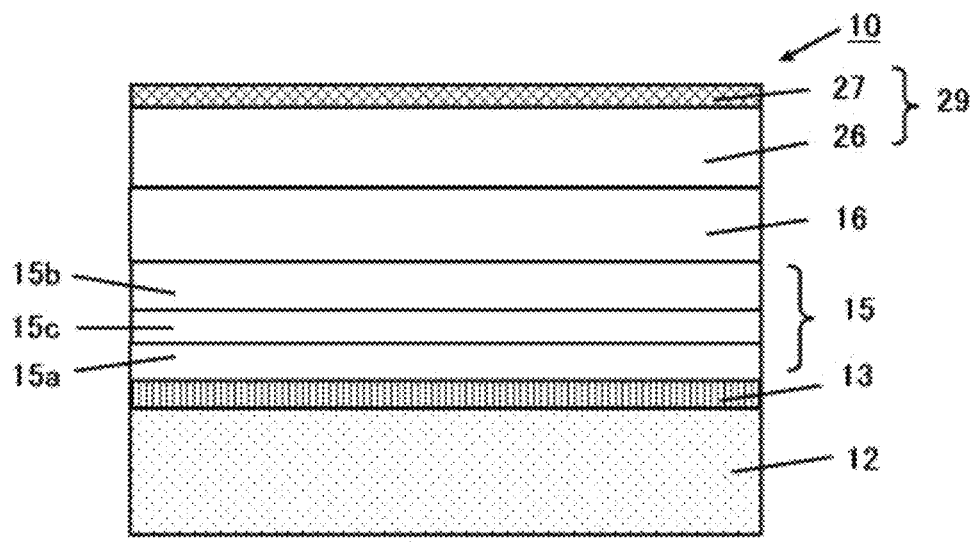
[FIG.4]
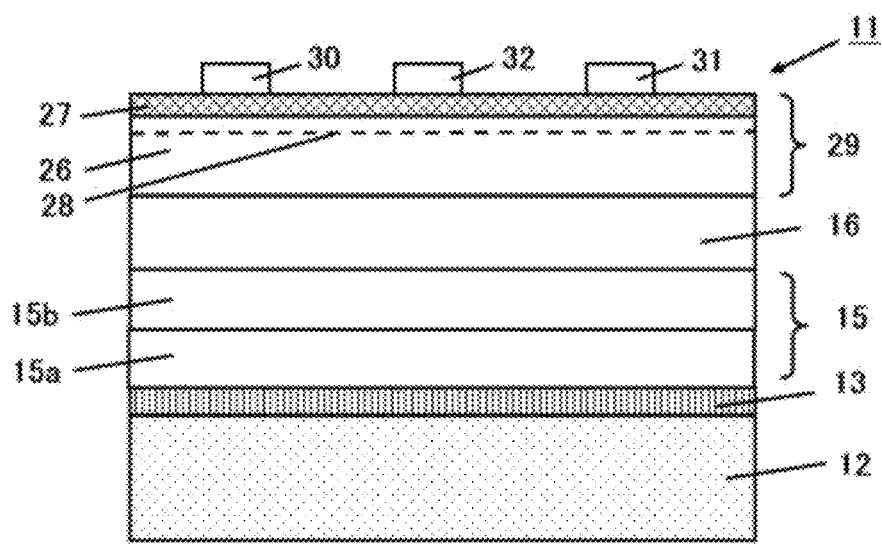

[FIG.5]
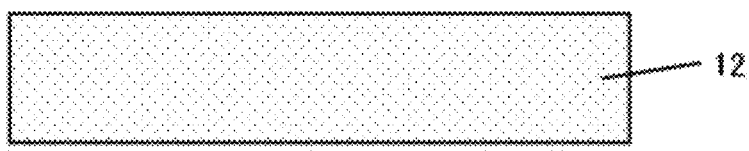
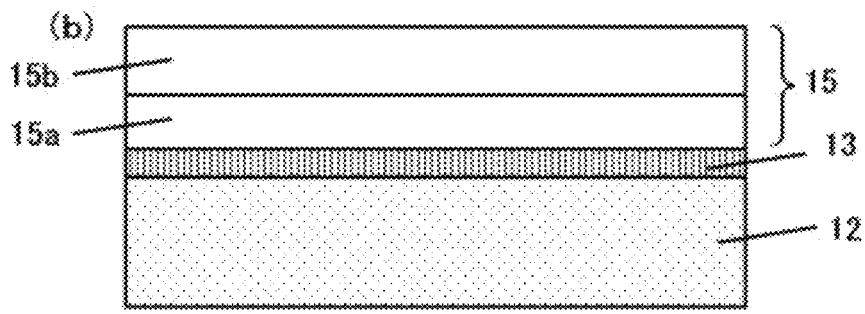
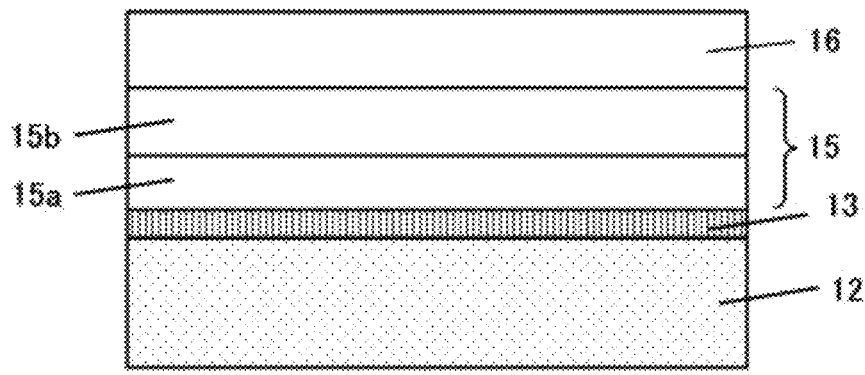

[FIG.6]
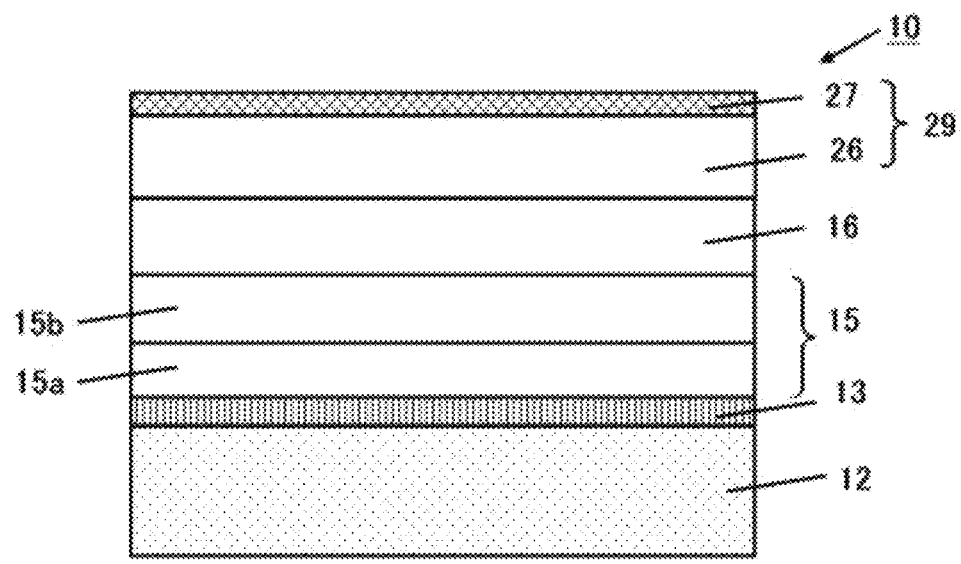
[FIG.7]
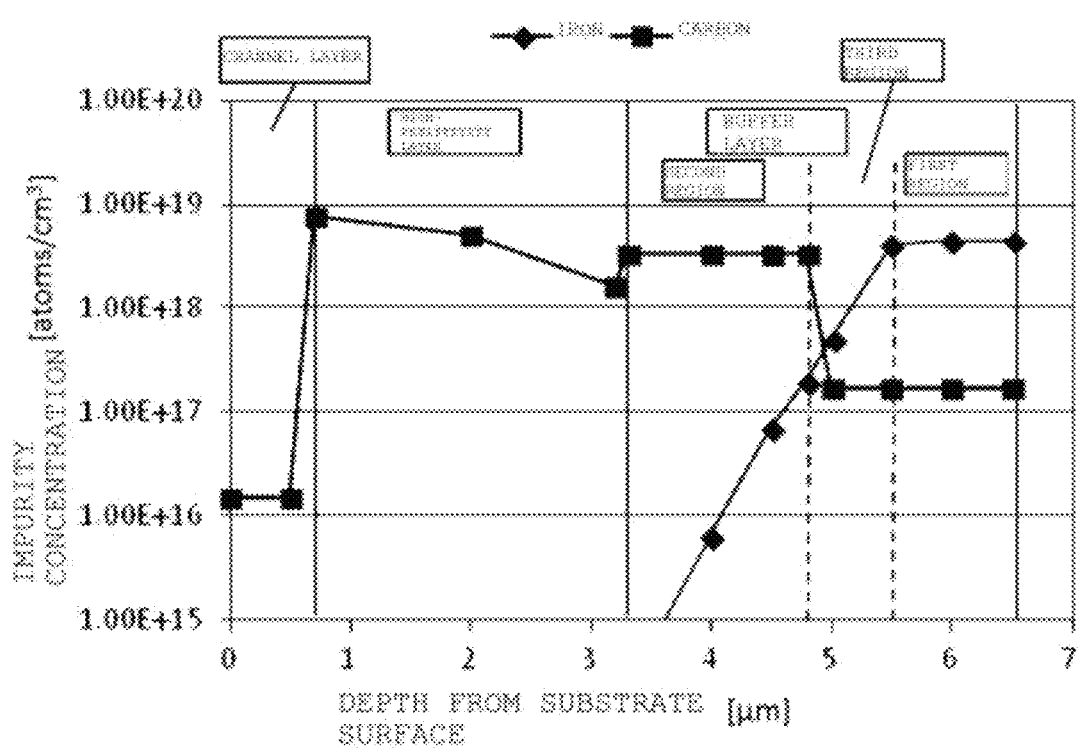

[FIG.8]
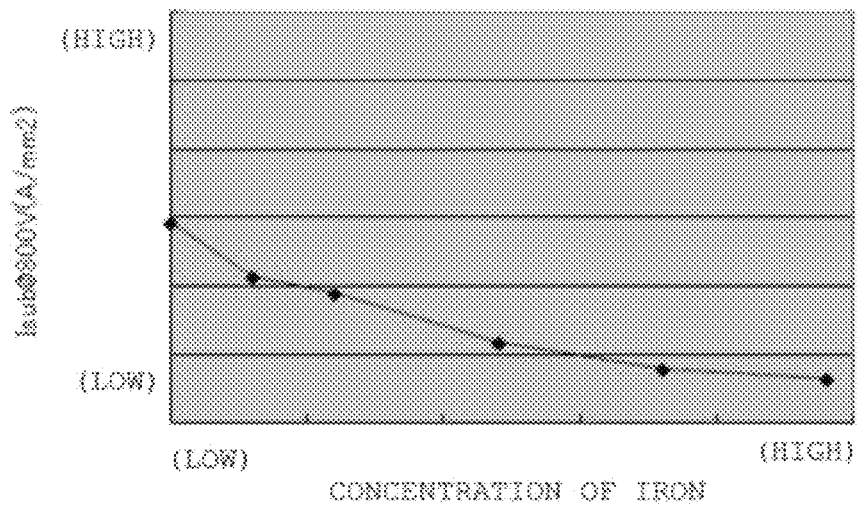
[FIG.9]
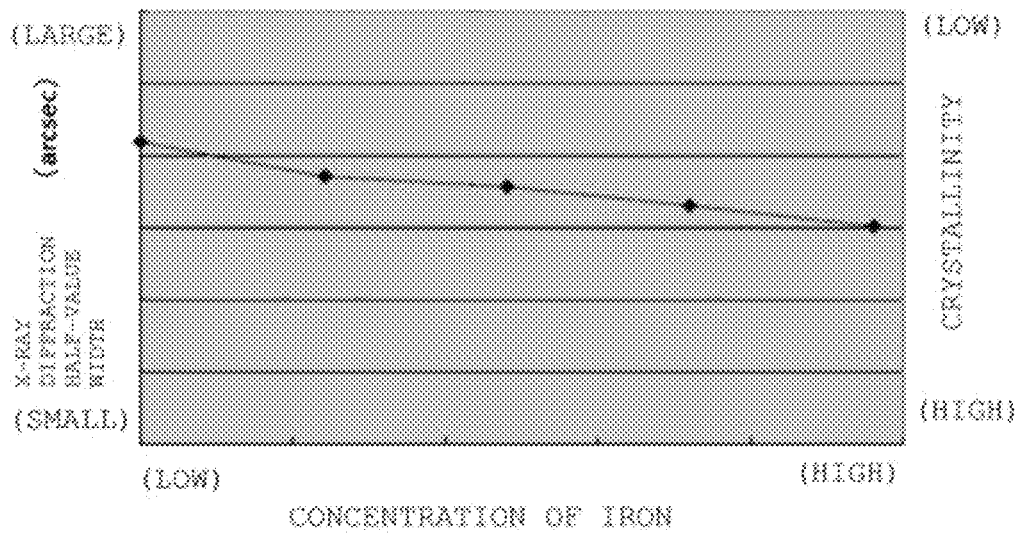

[FIG.10]
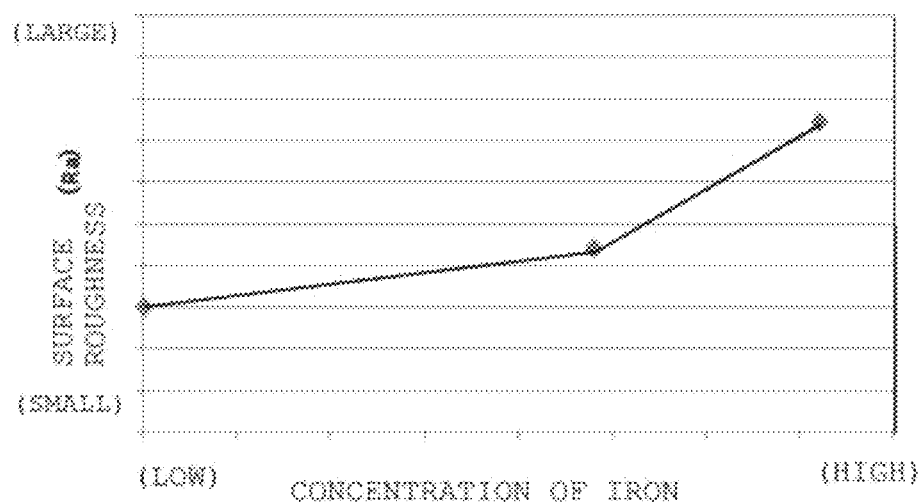
[FIG.11]
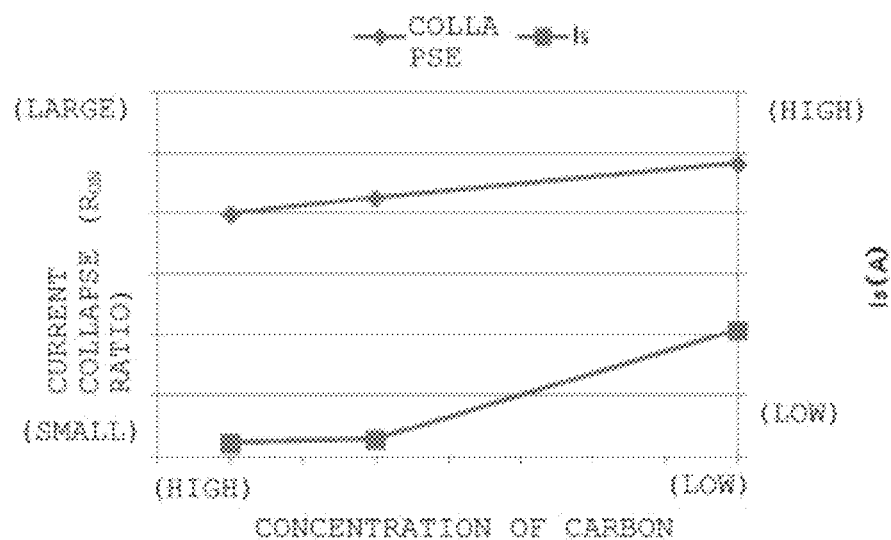

[FIG.12]
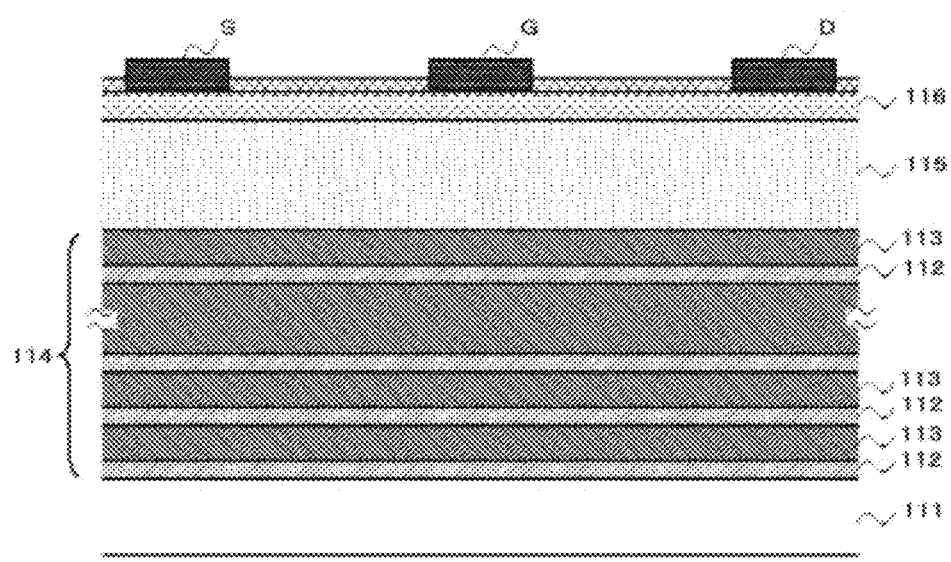

SEMICONDUCTOR DEVICE SUBSTRATE, SEMICONDUCTOR DEVICE, AND METHOD FOR MANUFACTURING SEMICONDUCTOR DEVICE SUBSTRATE

TECHNICAL FIELD

The present invention relates to a semiconductor device substrate, a semiconductor device, and a method for manufacturing a semiconductor device substrate.

BACKGROUND ART

Semiconductor device substrates using a nitride semiconductor are used for power devices which operate at high frequencies with high outputs. In particular, as a power device which is suitable for performing amplification in a high-frequency band of microwaves, submillimeter waves, millimeter wave, and the like, for example, a high electron mobility transistor (HEMT) is known.

Such a semiconductor device substrate used in the HEMT or the like is disclosed in, e.g., Patent Literature 1. In Patent Literature 1, as shown in FIG. 12, the semiconductor device substrate has a buffer layer 114 which is formed on a silicon substrate 111 and formed by alternately laminating first semiconductor layers 112 constituted of AlN and second semiconductor layers 113 which is constituted of GaN and has Fe doped therein, a channel layer 115 which is formed on the buffer layer 114 and constituted of GaN, and a barrier layer 116 which is formed on the channel layer 115 and constituted of AlGaN.

It is to be noted a semiconductor device can be obtained by providing a source electrode S, a drain electrode D, and a gate electrode G on the semiconductor device substrate.

In the semiconductor device disclosed in Patent Literature 1, breakdown voltage in the longitudinal direction is improved by doping iron in the buffer layer 114.

However, it is known that, in doping of Fe, precipitous control cannot be conducted due to surface segregation or the like and hence Fe is mixed into an upper layer (namely, the channel layer) (see Patent Literature 2). It is known that mixture of this Fe into the channel layer exerts an adverse effect such as a reduction in mobility on forward characteristics, and using a structure and a manufacturing process which prevents mixture into the channel layer is preferable.

A structure which prevents Fe used for increasing a resistivity from being introduced into the upper channel layer is disclosed in, e.g., Patent Literatures 2 to 4.

CITATION LIST

Patent Literatures

Patent Literature 1: JP2010-123725A
Patent Literature 2: JP2013-074211A
Patent Literature 3: JP2010-232297A
Patent Literature 4: JP2010-182872A

SUMMARY OF INVENTION

Technical Problem

In a semiconductor device having electrodes provided on a semiconductor device substrate including a buffer layer having iron (Fe) doped therein, when a source electrode S is electrically connected to a silicon substrate 111 and a predetermined voltage is applied between a source and a drain in an OFF state, a longitudinal leak can be suppressed. However, the present inventors have discovered that, in a high-temperature operation, a leak in a transverse direction (between a drain electrode D and the source electrode S) which flows through the buffer layer 114 increases.

Further, when carbon is contained in the buffer layer to solve the problem, the leak current in the transverse direction in the high-temperature operation can be suppressed, but there occurs a problem that extremely increasing average concentration of the carbon lowers crystallinity of the buffer layer and easily degrades a current collapse phenomenon.

In view of the above-described problem, it is an object of the present invention to provide a semiconductor device substrate, a semiconductor device, and a method for manufacturing a semiconductor device substrate which can suppress a transverse leak current in a high-temperature operation of a device while suppressing a longitudinal leak current and can also suppress a current collapse phenomenon.

Solution to Problem

To achieve the object, the present invention provides a semiconductor device substrate including: a substrate; a buffer layer which is provided on the substrate and made of a nitride semiconductor; and a device active layer which is formed of a nitride semiconductor layer provided on the buffer layer, the semiconductor device substrate being characterized in that the buffer layer includes: a first region which contains carbon and iron; and a second region which is provided on the first region and has average concentration of iron lower than that in the first region and average concentration of carbon higher than that in the first region, and the average concentration of the carbon in the second region is lower than the average concentration of the iron in the first region.

With such an arrangement, it is possible to suppress the leak current in the transverse direction in a high-temperature operation of a device which flows between a source and a drain through the buffer layer while suppressing the leak current in the longitudinal direction. Furthermore, the current collapse phenomenon can be suppressed.

At this time, it is preferable that the first region includes a lower surface of the buffer layer, and the second region includes an upper surface of the buffer layer.

Since average concentration profiles of the iron and the carbon in the first region and the second region are as described above, the leak current in the transverse direction in the high-temperature operation can be efficiently suppressed while suppressing the leak current in the longitudinal direction.

At this time, it is preferable for a sum of the average concentration of the carbon and the average concentration of the iron in the first region to be larger than a sum of the average concentration of the carbon and the average concentration of the iron in the second region.

When the concentration profiles of the carbon and the iron in the first region and the second region are as described above, it is possible to assuredly suppress the current collapse phenomenon while suppressing the leak current in the longitudinal direction.

At this time, it is preferable for the first region to be thicker than the second region.

When the first region containing iron in high concentration is made thicker than the second region, the leak current in the longitudinal direction can be more effectively suppressed.

At this time, the first region can include a plurality of nitride semiconductor layers which are different in composition.

As the first region constituting the buffer layer, such a laminated structure can be preferably used.

Moreover, the second region can include a plurality of nitride semiconductor layers which are different in composition.

As the second region constituting the buffer layer, such a laminated structure can be preferably used.

At this time, it is preferable that the first region and the second region contain either or both of Al and Ga, and average Al concentration in the first region is lower than average Al concentration in the second region.

When the average Al concentration in the upper region of the buffer layer is increased to be higher than the average Al concentration in the lower region of the buffer layer, a warp of the substrate can be reduced, and production of inner cracks can be suppressed while decreasing outer peripheral cracks.

At this time, it is preferable that a third region which has a sum of average concentration of carbon and average concentration of iron smaller than a sum of the average concentration of the carbon and the average concentration of the iron in the second region and a sum of the average concentration of the carbon and the average concentration of the iron in the first region is provided between the first region and the second region.

When such a third region is provided, flatness of the upper surface of the buffer layer can be improved while enhancing the crystallinity of the semiconductor layer.

At this time, it is preferable for a thickness of each of the first region and the second region to be 400 nm or more.

When the first region containing iron in high concentration is 400 nm thick or more, the leak current in the longitudinal direction can be effectively suppressed. Further, when the second region whose average concentration of the iron is lower than that of the first region and whose average concentration of the carbon is higher than that of the same is 400 nm thick or more, mixing of Fe into the device active layer can be effectively suppressed, and the current collapse phenomenon can be more effectively suppressed.

At this time, it is preferable that the average concentration of the iron in the second region is $1\times10^{16}$ atoms/cm$^3$ or less, and the average concentration of the iron in the first region is $1\times10^{18}$ atoms/cm$^3$ or more.

When the average concentration of the iron in the second region is $1\times10^{16}$ atoms/cm$^3$ or less, mixing of Fe into the device active layer can be further assuredly suppressed. Furthermore, when the average concentration of the iron in the first region is $1\times10^{18}$ atoms/cm$^3$ or more, the leak current in the longitudinal direction can be further assuredly effectively suppressed.

At this time, it is preferable that the device active layer includes a channel layer made of a nitride semiconductor which has average concentration of carbon lower than that in the second region and average concentration of iron lower than that in the first region, and a high-resistivity layer made of a nitride semiconductor which has average concentration of carbon equal to or higher than that in the second region and average concentration of iron lower than that in the first region is provided between the device active layer and the buffer layer.

As the device active layer of the semiconductor device substrate, such a channel layer can be appropriately included. Additionally, when such a high-resistivity layer is provided between the device active layer and the buffer layer, degradation of the current collapse phenomenon and the transverse leak current at high temperatures can be more assuredly suppressed, mixture of Fe into the channel layer can be further assuredly inhibited, and hence degradation in forward characteristics, for example, a decrease in mobility can be more assuredly prevented.

Further, the present invention provides a semiconductor device including the semiconductor device substrate, the semiconductor device being characterized in that the device active layer includes on the channel layer a barrier layer made of a nitride semiconductor whose band gap is different from that of the channel layer, and the semiconductor device further includes an electrode which is electrically connected to a two-dimensional electron gas layer formed in the vicinity of an interface between the channel layer and the barrier layer.

According to such a semiconductor device, it is possible to supply the semiconductor device which can suppress the transverse leak current in a high-temperature operation of a device while suppressing the longitudinal leak current and can suppress the electric collapse phenomenon.

Furthermore, the present invention provides a method for manufacturing a semiconductor device substrate including: forming a buffer layer made of a nitride semiconductor on a substrate; and forming a device active layer made of a nitride semiconductor on the buffer layer, the method being characterized in that forming the buffer layer includes: a step of forming a first region containing carbon and iron; and forming a second region which has average concentration of the iron lower than that in the first region and average concentration of the carbon higher than that in the first region on the first region, and the average concentration of the carbon in the second region is set to be lower than the average concentration of the iron in the first region.

When such a method for manufacturing a semiconductor device substrate is used, it is possible to manufacture the semiconductor device substrate which can suppress the transverse leak current in a high-temperature operation of a device while suppressing the longitudinal leak current and can suppress the electric collapse phenomenon.

At this time, a growth temperature of the second region can be set lower than a growth temperature of the first region.

To increase the average concentration of the carbon in the second region to be higher than the average concentration of the carbon in the first region, the growth temperature of the second region can be decreased to be lower than the growth temperature of the first region in a preferred range.

Advantageous Effects of Invention

As described above, according to the semiconductor device substrate of the present invention, it is possible to suppress the transverse leak current in a high-temperature operation of a device while suppressing the longitudinal leak current and also suppress the current collapse phenomenon. Furthermore, according to the semiconductor device of the present invention, it is possible to provide the semiconductor device which can suppress the transverse leak current in a high-temperature operation of a device while suppressing the longitudinal leak current and can also suppress the current collapse phenomenon. Moreover, using the method for manufacturing a semiconductor device substrate of the present invention enables manufacturing the semiconductor device substrate which can suppress the transverse leak current in a high-temperature operation of a device while suppressing the longitudinal leak current and can suppress the current collapse phenomenon.

BRIEF DESCRIPTION OF DRAWINGS

FIG. 1 is a cross-sectional view showing an example of an embodiment of a semiconductor device substrate according to the present invention;

FIG. 2 is cross-sectional views showing an example and another example of a buffer layer constituting the semiconductor device substrate according to the present invention, respectively;

FIG. 3 is a cross-sectional view showing another example of the embodiment of the semiconductor device substrate according to the present invention;

FIG. 4 is a cross-sectional view showing an example of an embodiment of a semiconductor device according to the present invention;

FIG. 5 is step cross-sectional views showing an example of an embodiment of a method for manufacturing a semiconductor device substrate according to the present invention;

FIG. 6 is step cross-sectional views (continued from FIG. 5) showing the example of the embodiment of the method for manufacturing a semiconductor device substrate according to the present invention;

FIG. 7 is a view showing an impurity profile in a depth direction of the semiconductor device substrate according to an example;

FIG. 8 is a view showing buffer layer iron concentration dependence of a leak current in a longitudinal direction;

FIG. 9 is a view showing buffer layer iron concentration dependence of surface crystallinity;

FIG. 10 is a view showing buffer layer iron concentration dependence of surface roughness;

FIG. 11 is a view showing buffer layer carbon concentration dependence of current collapse and a leak current in a transverse direction at the time of a high-temperature operation; and FIG. 12 is a cross-sectional view showing a conventional semiconductor substrate.

DESCRIPTION OF EMBODIMENTS

As described above, the present inventors have discovered that, in a buffer layer structure having Fe doped therein, a leak current in a longitudinal direction can be suppressed, but a leak current in a transverse direction increases in a high-temperature operation.

Thus, the present inventors have conducted keen examinations on a semiconductor device substrate which can reduce the leak current in the transverse direction in the high-temperature operation while suppressing the leak current in the longitudinal direction. Consequently, they have discovered that increasing concentration of carbon rather than iron is good for the leak current in the transverse direction in the high-temperature operation, average concentration of carbon in an upper region of the buffer layer has been raised to be higher than average concentration of carbon in a lower region of the buffer layer. Further, since a longitudinal leak current suppression effect of iron is higher than that of carbon in both a room-temperature operation and the high-temperature operation, the average concentration of the iron in the lower region of the buffer layer is raised to be higher than the average concentration of the iron in the upper region of the buffer layer. Consequently, they have discovered that the leak current in the transverse direction in the high-temperature operation can be reduced while suppressing an increase in the leak current in the longitudinal direction in the room-temperature operation or the high-temperature operation.

Meanwhile, the concentration of the carbon can be precipitously changed as compared with that of the iron, but a growth temperature is lowered at the time of, for example, forming a film for the upper region of the buffer layer to raise the carbon concentration in the upper region of the buffer layer. Then, the carbon concentration in the semiconductor layer largely varies due to temperatures, a warp of the substrate becomes large, and cracks are apt to be produced. Furthermore, when the carbon concentration is raised too much in the upper region of the buffer layer, crystallinity near the upper surface of the buffer layer is lowered, and the current collapse phenomenon is prone to degrade.

Thus, the present inventors have further conducted the keen examinations on the semiconductor device substrate which can suppress the transverse leak current at high temperatures while suppressing the longitudinal leak current and can also suppress the current collapse phenomenon. Consequently, they have made the present invention which reduces average concentration of carbon in a second region on an upper side of the buffer layer to be lower than average concentration of iron in a first region.

The present invention will now be described hereinafter in detail as an example of an embodiment with reference to the drawings, but the present invention is not restricted thereto.

First, a description will be given on an example of an embodiment of a semiconductor device substrate according to the present invention with reference to FIGS. 1 to 3.

A semiconductor device substrate 10 shown in FIG. 1 has a substrate (e.g., a silicon-based substrate) 12, a buffer layer 15 which is provided on the silicon-based substrate 12 and made of a nitride semiconductor, and a device active layer 29 which is provided on the buffer layer 15 and made of a nitride semiconductor. The device active layer 29 is constituted of, e.g., a channel layer 26 and a barrier layer 27 having a band gap different from that of the channel layer 26.

Here, the silicon-based substrate 12 is a substrate made of, e.g., Si or SiC.

An initial layer 13 made of AlN may be provided between the silicon-based substrate 12 and the buffer layer 15.

As shown in FIG. 2(a), the buffer layer 15 may be a buffer layer 15' in which first layers 17 and second layers 18 having a lattice constant different from that of the first layers 17 are alternately laminated, and thicknesses of the respective layers may be different from each other.

Moreover, as shown in FIG. 2(b), the buffer layer 15 may be a buffer layer 15" in which laminated bodies 19 each of which has first layers 17 and second layers 18 having a lattice constant different from that of the first layers 17 alternately laminated therein and GaN insertion layers 20 are alternately laminated. It is to be noted that the first layers 17, the second layers 18, and the GaN insertion layers 20 have different concentrations in some cases, but average concentration when repetitive lamination is performed is average concentration which is a total of concentrations of the laminated bodies 19 and the GaN insertion layers 20 which are repeated.

The buffer layer 15 has a first region 15a which contains carbon and iron as impurities and a second region 15b which is provided on the first region 15a, has average concentration of iron lower than that in the first region 15a, and has average concentration of carbon higher than that in the first region 15a, and the average concentration of carbon in the second region 15b is lower than the average concentration of iron in the first region 15a.

Here, the first region 15a may be a region having iron gas-doped therein.

In this manner, the average concentration of the iron in the second region 15b of the buffer layer 15 is decreased to be lower than the average concentration of the iron in the first region 15a of the buffer layer 15, and the average concentration of the carbon in the second region 15b of the buffer layer 15 is increased to be higher than the average concentration of the carbon in the first region 15a of the buffer layer 15. Consequently, a transverse leak current in a high-temperature operation of a device can be suppressed. Additionally, when the average concentration of the carbon in the second region 15b of the buffer layer 15 is set to $5 \times 10^{17}$ atoms/cm$^3$ or more or preferably to $1 \times 10^{18}$ atoms/cm$^3$ or more and $2 \times 10^{19}$ atoms/cm$^3$ or less and decreased to be lower than the average concentration of the iron in the first region 15a of the buffer layer 15, degradation of crystallinity near an upper surface of the buffer layer 15 can be suppressed, and the current collapse phenomenon can be suppressed.

To increase breakdown voltage of the buffer layer 15, it is better to mix the iron rather than the carbon. However, the iron concentration cannot be precipitously lowered as compared with the carbon concentration. Thus, to sufficiently decrease the iron concentration on the upper surface of the buffer layer 15, the iron concentration in the first region is increased to be higher than the iron concentration in the second region. On the other hand, since the carbon concentration can be relatively precipitously changed, the carbon concentration in the second region is increased to be higher than the carbon concentration in the first region. Consequently, a reduction in breakdown voltage can be suppressed by lowering the concentration of the iron in the second region.

In the semiconductor device substrate which is an example of the embodiment according to the present invention, it is preferable that the first region 15a includes the lower surface of the buffer layer 15 and the second region 15b includes the upper surface of the buffer layer 15. Since average concentration profiles of the iron and the carbon in the first region and the second region are as described above, it is possible to further efficiently suppress the leak current in the transverse direction in a high-temperature operation while suppressing the leak current in the longitudinal direction.

In the semiconductor device substrate which is an example of the embodiment according to the present invention, the first region 15a may include a plurality of nitride semiconductor layers which are different in composition. As the first region constituting the buffer layer, such a laminated structure can be preferably used.

In the semiconductor device substrate which is an example of the embodiment according to the present invention, the second region 15b may include a plurality of nitride semiconductor layers which are different in composition. As the second region constituting the buffer layer, such a laminated structure can be preferably used.

In the semiconductor device substrate which is an example of the embodiment according to the present invention, the first region 15a and the second region 15b contain either or both of Al and Ga, and it is preferable for average Al concentration in the first region 15a to be lower than average Al concentration in the second region 15b. When the average Al concentration in the upper region of the buffer layer is increased to be higher than the average Al concentration in the lower region of the buffer layer in this manner, a warp of the substrate can be reduced, and outer peripheral cracks can be suppressed.

In the semiconductor device substrate which is an example of the embodiment according to the present invention, it is preferable to provide between the first region 15a and the second region 15b a third region 15 which has a sum of the average concentration of the carbon and the average concentration of the iron smaller than a sum of the average concentration of the carbon and the average concentration of the iron in the second region 15b and a sum of the average concentration of the carbon and the average concentration of the iron in the first region 15a (see FIG. 3). When such a third region is provided, flatness of the buffer layer can be improved. This can be realized for the following reason. When the carbon in the semiconductor layer is high, the crystallinity of the semiconductor layer is lowered. When the iron concentration is increased, a high resistivity and high crystallinity are provided but, on the other hand, unevenness is apt to be produced. Inserting such a third region having the low carbon concentration and iron concentration between the first region and the second region enables recovering the crystallinity and the flatness.

In the semiconductor device substrate which is an example of the embodiment according to the present invention, it is preferable for a thickness of each of the first region 15a and the second region 15b to be 400 nm or more.

When the first region containing the iron in high concentration is 400 nm thick or more, the leak current in the longitudinal direction can be more effectively suppressed. Further, when the second region having the lower average concentration of the iron and the higher average concentration of the carbon as compared with the counterparts in the first region is 400 nm thick or more, mixing of Fe into the device active layer can be more effectively inhibited, and the current collapse phenomenon can be also more effectively suppressed.

Furthermore, when the thickness of the second region 15b is set to 1.5 µm or less, the high crystallinity can be obtained while suppressing cracks, and the transverse leak current in a high-temperature operation can be excellently inhibited.

In the semiconductor device substrate which is an example of the embodiment according to the present invention, it is preferable for the average concentration of the iron in the second region 15b to be $1 \times 10^{16}$ atoms/cm$^3$ or less and for the average concentration of the iron in the first region 15a to be $1 \times 10^{18}$ atoms/cm$^3$ or more. When the average concentration of the iron in the second region is $1 \times 10^{16}$ atoms/cm$^3$ or less, mixing of Fe into the device active layer can be more assuredly suppressed. Moreover, when the average concentration of the iron in the first region is $1 \times 10^{18}$ atoms/cm$^3$ or more, the leak current in the longitudinal direction can be more effectively suppressed.

In the semiconductor device substrate which is an example of the embodiment according to the present invention, it is preferable for the device active layer 29 to include a channel layer 26 which is made of a nitride semiconductor having average concentration of the carbon lower than that in the second region 15b and average concentration of the iron lower than that in the first region 15a, and preferable to provide between the device active layer 29 and the buffer layer 15 a high-resistivity layer 16 which is made of a nitride semiconductor having average concentration of the carbon higher than or carbon concentration equivalent to that in the second region 15b and having average concentration of the iron lower than that in the first region 15a. As the device active layer of the semiconductor device substrate, such a channel layer can be preferably included. Moreover, when such a high-resistivity layer is provided between the device active layer and the buffer layer, degradation of the current collapse phenomenon and the transverse leak current at high temperatures can be more assuredly suppressed, mixing of Fe into the channel layer can be more securely inhibited, and hence degradation in forward characteristics such as a reduction in mobility of electrons in the channel layer can be further assuredly prevented.

An example of an embodiment of a semiconductor device according to the present invention will now be described with reference to FIG. 4.

A semiconductor device 11 shown in FIG. 4 has a source electrode 30, a drain electrode 31, and a gate electrode 32 provided on the semiconductor device substrate 10 described above with reference to FIG. 1. The semiconductor device 11 is, e.g., a high electron mobility transistor (HEMT).

The source electrode 30 and the drain electrode 31 are electrically connected to a two-dimensional electron gas layer 28 formed in the vicinity of an interface between a channel layer 26 and a barrier layer 27, and arranged in such a manner that an electric current can flow from the source electrode 30 to the drain electrode 31 through the two-dimensional gas layer 28. The electric current flowing between the source electrode 30 and the drain electrode 31 can be controlled by using a potential applied to the gate electrode 32.

According to such a semiconductor device, it is possible to supply a semiconductor device which can suppress a transverse leak current in a high-temperature operation of the device while suppressing a longitudinal leak current and can inhibit a current collapse phenomenon.

It is to be noted that the present invention can be also applied to a lateral device (MOSFET or the like) other than HEMT.

A description will now be given as to an example of an embodiment of a method for manufacturing a semiconductor device substrate according to the present invention with reference to FIGS. 5 and 6.

A silicon-based substrate (a substrate) 12 is prepared (see FIG. 5(a)).

Specifically, as the silicon-based substrate 12, a silicon substrate or an SiC substrate is prepared. The silicon substrate or the SiC substrate is generally used as a growth substrate for a nitride semiconductor layer.

Then, a buffer layer 15 constituted of a nitride semiconductor layer is formed on the silicon-based substrate 12 (see FIG. 5(b)).

Forming this buffer layer 15 includes forming a first region 15a containing carbon and iron and forming on the first region 15a a second region 15b which has average concentration of the iron lower than that of the first region 15a and average concentration of the carbon higher than that of the first region 15a.

Further, in forming the buffer layer 15, the average concentration of the carbon in the second region 15b is decreased to be lower than the average concentration of the iron in the first region.

Here, when formation of the first region 15a is completed, doping of the iron is stopped, and iron concentration in a film formed at subsequent steps can be decreased from the substrate 12 side toward a device active layer 29 side. After stopping the doping of the iron, a growth temperature is lowered to form the second region having the high average concentration of the carbon. It is to be noted that, after stopping the doping of the iron and forming the nitride semiconductor layer for a while, lowering the growth temperature to form the second region enables providing a third region 15c in FIG. 3 between the first region 15a and the second region 15b.

It is to be noted that concentration of Fe can be controlled by controlling a flow rate of Cp2Fe (biscyclopentadienyl iron) in addition to an effect of segregation or auto-doping.

Moreover, addition of the carbon is performed by taking the carbon contained in a starting material gas (TMG (trimethylgallium) or the like) into a film at the time of growing a nitride-based semiconductor layer by an MOVPE (metal organic vapor phase growth) method, but it can be likewise performed with the use of a doping gas such as propane.

It is to be noted that an AlN initial layer 13 may be formed before forming the buffer layer 15 (see FIG. 5(b)).

Then, a high-resistivity layer 16 is formed on the buffer layer 15 by epitaxial growth (see FIG. 15(c)). The high-resistivity layer 16 may have carbon concentration set to $1 \times 10^{18}$ atoms/cm$^3$ or more and have a thickness set to 2 μm or more, for example. It is to be noted that forming the high-resistivity layer 16 may be omitted.

Then, a device active layer 29 which is made of a nitride semiconductor is formed on the high-resistivity layer 16 by epitaxial growth (see FIG. 6).

Specifically, a channel layer 26 made of GaN and a barrier layer 27 made of AlGaN are formed on the high-resistivity layer 16 by the MOVPE method in the mentioned order. A film thickness of the channel layer 26 is, e.g., 50 to 4000 nm, and a film thickness of the barrier layer 27 is, e.g., 10 to 50 nm.

In this manner, the semiconductor device substrate 10 in FIG. 1 is provided.

When the average concentration of the iron in the second region 15b of the buffer layer 15 is decreased to be lower than the average concentration of the iron in the first region 15a of the buffer layer 15 and the average concentration of the carbon in the second region 15b of the buffer layer 15 is increased to be higher than the average concentration of the carbon in the first region 15a of the buffer layer 15, the transverse leak current in a high-temperature operation of a device can be suppressed. Further, when the average concentration of the carbon in the second region 15b of the buffer layer 15 is decreased to be lower than the average concentration of the iron in the first region 15a of the buffer layer 15, the crystallinity near the upper surface of the buffer layer 15 can be improved, and the current collapse phenomenon can be suppressed.

In the method for manufacturing a semiconductor device substrate according to an example of the embodiment of the present invention, a growth temperature of the second region 15b is reduced to be lower than a growth temperature of the first region 15a. Consequently, the average concentration of the carbon in the second region can be readily increased to be higher than the average concentration of the carbon in the first region.

Furthermore, as shown in FIG. 2(a), the buffer layer 15 may be formed into a laminated structure in which first layers (e.g., AlN layers) 17 and second layers (e.g., GaN layers) 18 are alternately laminated. In this case, a growth temperature is decreased at the time of formation of the second region 15b for the purpose of increasing the carbon concentration. A growth rate of AlN rises when the growth temperature is decreased and, on the other hand, a growth rate of GaN lowers when the growth temperature is decreased. Consequently, in case of setting film thicknesses of AlN and GaN to the same film thickness ratio in the first region and the second region, when a growth time in the first region is the same as that in the second region, a deviation from desired film thicknesses occurs. Consequently, cracks which are caused during the epitaxial growth or crack which are caused during a process are apt to be produced, but production of the cracks can be suppressed by correcting a growth rate fluctuation in accordance with the growth temperatures and performing adjustment so that the film thickness ratio in the second region 15b becomes equal to the film thickness ratio in the first region 15a. It is to be noted that the growth rate fluctuation can be corrected by correcting growth times.

Moreover, as shown in FIG. 2(b), the buffer layer 15 can be formed into a laminated structure in which laminated bodies 19 each having first layers (e.g., AlN layers) 17 and second layers (e.g., GaN layers) 18 alternately laminated therein and GaN insertion layers 20 are alternately laminated. In this case, in a state where the average Al concentration in the second region 15b is equalized with (or increased above) that in the first region 15a, the number of pairs of the laminated bodies 19 and the GaN insertion layers 20 is decreased and the GaN insertion layers 20 are thinned, thereby further effectively suppressing production of cracks in the epitaxial growth and cracks in the device formation process.

When the above-described method for manufacturing a semiconductor device substrate is used, it is possible to manufacture a semiconductor device substrate which can suppress the transverse leak current in a high-temperature operation of a device while inhibiting the longitudinal leak current, suppress production of cracks, and inhibit the current collapse phenomenon.

EXAMPLE

The present invention will now be more specifically described hereinafter with reference to an example, but the present invention is not restricted thereto.

Example

A semiconductor device substrate was fabricated by using the method for manufacturing a semiconductor device substrate described with reference to FIGS. 5 and 6. However, an initial layer 13 made of AlN was formed on a substrate 12 as an initial layer, and an Fe-doped layer (iron concentration: $1 \times 10^{18}$ atoms/cm$^3$ or more) was formed on the initial layer 13 as a first region 15a. The first region 15a was formed into a such a laminated layer as shown in FIG. 2(b) which is a laminated structure in which six pairs of laminated bodies 19, each of which has eight pairs of AlN layers 17 and GaN layers 18 alternately laminated therein, and GaN insertion layers 20 are alternately laminated.

An Fe-undoped layer (a layer formed without introducing Cp$_2$Fe: a third region 15c and a second region 15b) was formed on the first region 15a. Carbon concentration in an upper layer (the second region 15b) of the Fe-undoped layer was set to $1 \times 10^{18}$ atoms/cm$^3$ or more and set to be smaller than iron concentration in the first region 15a. Additionally, such a laminated structure as shown in FIG. 2(b) was adopted, which is a laminated structure in which five pairs of laminated bodies 19, each of which has eight pairs of AlN layers 17 and GaN layers 18 alternately laminated therein, and GaN insertion layers 20 are alternately laminated. Carbon concentration in a lower layer (the third region 15c) of the Fe-undoped layer was set to be smaller than carbon iron concentration in the second region 15b, and such a laminated structure as shown in FIG. 2(b) was formed, which is a laminated structure in which four pairs of laminated bodies 19, each of which has eight pairs of AlN layers 17 and GaN layers 18 alternately laminated therein, and GaN layers 20 are alternately laminated.

As a high-resistivity layer 16, a layer having carbon concentration of $1 \times 10^{18}$ atoms/cm$^3$ or more was formed with a thickness of 2.7 μm on the Fe-undoped layer, a layer with low carbon concentration and a channel layer 26 were further formed thereon, and a barrier layer 27 made of AlGaN and a cap layer made of GaN were further formed thereon.

It is to be noted that, to increase the carbon concentration in the second region 15b, a growth temperature of the second region 15b was set to be 50 degrees lower than a growth temperature of the first region 15a. At this time, a growth rate fluctuation was corrected in accordance with the growth temperature of the second region 15b, and a film thickness ratio in the second region 15b was adjusted to be equal to a film thickness ratio in the first region 15a.

An impurity profile of the fabricated semiconductor device substrate in a depth direction was measured by SIMS analysis. This result is shown in FIG. 7. In FIG. 7, the average concentration of the carbon in the second region is higher than the average concentration of the carbon in the first region, the average concentration of the iron in the second region is lower than the average concentration of the iron in the first region, and the average concentration of the carbon in the second region is smaller than the average concentration of the iron in the first region. Further, a sum of the average concentration of the carbon and the average concentration of the iron in the third region is smaller than a sum of the average concentration of the carbon and the average concentration of the iron in the second region and a sum of the average concentration of the carbon and the average concentration of the iron in the first region. Furthermore, in the third region, a rising gradient of the average concentration of the carbon is more precipitous than a falling gradient of the average concentration of the iron.

FIG. 8 shows buffer layer iron concentration dependence of the longitudinal leak current. In FIG. 8, when the iron concentration in the buffer layer is increased, the leak current in the longitudinal direction is decreased. In the example, since the average concentration of the iron in the first region 15a is set to be higher than the average concentration of the iron in the second region 15b and the average concentration of the carbon in the second region 15b, the leak current in the longitudinal direction can be reduced in the first region 15a as shown in FIG. 8, and the leak current in the longitudinal direction can be reduced in the entire buffer layer 15.

FIG. 9 shows buffer layer iron concentration dependence of crystallinity of the surface. In FIG. 9, when the iron concentration in the buffer layer is increased, the crystallinity of the upper surface is improved. In the example, since the average concentration of the iron in the first region 15a is set to be higher than the average concentration of the iron in the second region 15b, the crystallinity of the surface of the first region 15a can be enhanced as shown in FIG. 9, and consequently the surface of the second region 15b formed on the first region 15a can be also enhanced. As a result, the crystallinity near the upper surface of the buffer layer 15 can be improved.

FIG. 10 shows buffer layer iron concentration dependence of surface roughness. In FIG. 10, when the iron concentration in the buffer layer is lowered, the surface roughness is reduced. In the example, since the average concentration of the iron in the second region 15b is set to be lower than the average concentration of the iron in the first region 15a, the surface roughness of the second region 15b can be decreased as shown in FIG. 10, and the surface roughness of the upper surface of the buffer layer 15 can be decrease.

FIG. 11 shows buffer layer carbon concentration dependence of the current collapse and the leak current in the traverse direction in a high-temperature operation. It is to be noted that an axis of ordinate on the left side of FIG. 11 represents an $R_{ON}$ ratio which is defined as a ratio of an ON resistance $R_{ON}$ in a non-collapse state (a normal state) and an ON resistance $R_{ON}'$ in a collapse state: $R_{ON}'/R_{ON}$, and shows how much the ON resistance has increased due to the collapse by using the $R_{ON}$ ratio. In FIG. 11, when the carbon concentration in the buffer layer is increased, the current collapse is suppressed, and the leak current in the traverse direction in a high-temperature operation is decreased. In the example, since the average concentration of the carbon in the second region 15b is set to be higher than the average concentration of the carbon in the first region 15a, the current collapse can be suppressed as shown in FIG. 11. Moreover, the transverse leak current in a high-temperature operation can be reduced in the second region 15b, and the transverse leak current in a high-temperature operation can be reduced in the entire buffer layer 15.

It is to be noted that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. A semiconductor device substrate comprising:
    a substrate;
    a device active layer that is a nitride semiconductor layer; and
    a buffer layer disposed on the substrate and composed of nitride semiconductor, the device active layer being disposed on the buffer layer, the buffer layer comprising:
        a first region which contains carbon and iron; and
        a second region disposed on the first region,
    wherein the second region has an average concentration of iron lower than that in the first region and an average concentration of carbon higher than that in the first region, the average concentration of the carbon in the second region is lower than the average concentration of the iron in the first region, and
    the first region and the second region contain either or both of Al and Ga, and an average Al concentration in the first region is lower than an average Al concentration in the second region.

2. The semiconductor device substrate according to claim 1,
    wherein the first region includes a lower surface of the buffer layer, and
    the second region includes an upper surface of the buffer layer.

3. The semiconductor device substrate according to claim 1, wherein a sum of the average concentration of the carbon and the average concentration of the iron in the first region is larger than a sum of the average concentration of the carbon and the average concentration of the iron in the second region.

4. The semiconductor device substrate according to claim 2, wherein a sum of the average concentration of the carbon and the average concentration of the iron in the first region is larger than a sum of the average concentration of the carbon and the average concentration of the iron in the second region.

5. The semiconductor device substrate according to claim 1, wherein the first region is thicker than the second region.

6. The semiconductor device substrate according to claim 2, wherein the first region is thicker than the second region.

7. The semiconductor device substrate according to claim 3, wherein the first region is thicker than the second region.

8. The semiconductor device substrate according to claim 4, wherein the first region is thicker than the second region.

9. The semiconductor device substrate according to claim 1, wherein the first region includes a plurality of nitride semiconductor layers which are different in composition.

10. The semiconductor device substrate according to claim 1, wherein the second region includes a plurality of nitride semiconductor layers which are different in composition.

11. The semiconductor device substrate according to claim 1, further comprising:
    a third region disposed between the first region and the second region,
    wherein the third region has a sum of an average concentration of carbon and an average concentration of iron smaller than a sum of the average concentration of the carbon and the average concentration of the iron in the second region and a sum of the average concentration of the carbon and the average concentration of the iron in the first region.

12. The semiconductor device substrate according to claim 1, wherein a thickness of each of the first region and the second region is 400 nm or more.

13. The semiconductor device substrate according to claim 1,
    wherein the average concentration of the iron in the second region $1\times10^{16}$ atoms/cm$^3$ or less, and
    the average concentration of the iron in the first region is $1\times10^{18}$ atoms/cm$^3$ or more.

14. The semiconductor device substrate according to claim 1, further comprising:
    a high-resistivity layer disposed between the device active layer and the buffer layer, the high-resistivity layer being composed of nitride semiconductor,
    wherein the device active layer comprises a channel layer composed of nitride semiconductor and having an average concentration of carbon lower than that in the second region and an average concentration of iron lower than that in the first region; and
    the high-resistivity layer has an average concentration of carbon equal to or higher than that in the second region and an average concentration of iron lower than that in the first region.

15. A semiconductor device comprising:
    the semiconductor device substrate according to claim 1;
    a channel layer of the device active layer, the channel layer being composed of nitride semiconductor;
    a barrier layer of the device active layer, the barrier layer being disposed on the channel layer composed of nitride semiconductor whose band gap is different from that of the channel layer;
    a two-dimensional electron gas layer disposed near an interface between the channel layer and the barrier layer; and an electrode electrically connected to the two-dimensional electron gas layer.

16. A method for manufacturing a semiconductor device substrate comprising:
forming a buffer layer composed of nitride semiconductor on a substrate, by:
  forming a first region containing carbon and iron; and
  forming a second region which has an average concentration of the iron lower than that in the first region and an average concentration of the carbon higher than that in the first region on the first region; and
forming a device active layer composed of nitride semiconductor on the buffer layer,
wherein the average concentration of the carbon in the second region is set to be lower than the average concentration of the iron in the first region, and
the first region and the second region contain either or both of Al and Ga, and an average Al concentration in the first region is lower than an average Al concentration in the second region.

17. The method for manufacturing a semiconductor device substrate according to claim 16, wherein a growth temperature of the second region is set lower than a growth temperature of the first region.

* * * * *